United States Patent [19]

Bullock et al.

[11] Patent Number: 4,617,514
[45] Date of Patent: Oct. 14, 1986

[54] DISK AND GEAR MOUNTING IN ELECTRIC WATTHOUR METER

[75] Inventors: Donald F. Bullock, Somersworth; Austin F. Wilson, Rochester; Marshall A. Lemay, Hampton Falls; David B. Miles, Dover, all of N.H.

[73] Assignee: General Electric Company, Somersworth, N.H.

[21] Appl. No.: 711,642

[22] Filed: Mar. 14, 1985

[51] Int. Cl.[4] .................. G01R 11/02; F16C 23/02; F16C 27/02
[52] U.S. Cl. .................. 324/137; 324/154 PB; 384/247; 384/252; 384/295; 384/428; 384/215
[58] Field of Search .............. 384/247, 215, 248, 252, 384/295, 258, 296, 259, 428, 438, 439; 324/107, 137, 138, 154 R, 154 PB

[56] References Cited

U.S. PATENT DOCUMENTS

| | | |
|---|---|---|
| 2,639,199 | 5/1953 | Patrosio .............................. 384/247 |
| 2,940,044 | 6/1960 | Warsaw ............................. 324/137 X |
| 3,383,142 | 5/1968 | Scott .................................. 384/295 |

Primary Examiner—Stuart S. Levy
Assistant Examiner—David Werner
Attorney, Agent, or Firm—Robert E. Brunson; Thomas R. Morrison

[57] ABSTRACT

A watthour meter frame for an electric watthour meter includes pairs of orthogonal machined plane surfaces against which bearings are urged for accurately positioning the ends of a disk shaft of an electric watthour meter. Clearances are provided in the watthour meter frame for machining all pairs of machined surfaces without either changing the cutting tool or rotating the watthour meter frame. Worm gear bearings are similarly positioned in the watthour meter frame against three machined plane surfaces which may be machined in the same operation, and with the same cutting tool, as used in forming the pairs of machined surfaces for the disk shaft bearings. The worm gear bearings include a cylindrical barrel which is resiliently urged into contact with a pair of plane machined surfaces in a bearing well and a positioning flange having a bearing surface which is resiliently urged into a face surface surrounding the bearing well. Since the disk shaft and the worm gear are both located with respect to accurately machined plane surfaces in the watthour meter frame, sufficient relative and absolute accuracy is obtained to eliminate mesh adjustment of the worm gear.

7 Claims, 6 Drawing Figures

DISK AND GEAR MOUNTING IN ELECTRIC WATTHOUR METER

BACKGROUND OF THE INVENTION

The present invention relates to electric watthour meters and, more particularly, to apparatus for mounting a disk and a portion of the gearing of an electric watthour meter.

Conventional electro-mechanical electric watthour meters employ a conductive metal disk rotated as the rotor of a small induction motor by interaction with fluxes generated by opposed voltage and current stators. When the fluxes produced by the current and voltage stators are in quadrature, the rotational torque experienced by the disk is proportional to the voltage applied to the load multiplied by the current consumed by the load; that is, the power consumed by the load. Disk rotation is magnetically resisted in proportion to its rotational speed. Thus, the disk speed is proportional to the power consumed by the load. Each rotation of the disk represents a predetermined increment of energy consumed. The rotations of the disk are accumulated over time in a mechanical or electronic accumulator, or register, for billing purposes by the utility supplying the power.

The induction motor in the electric watthour meter is normally limited to extremely low power dissipation since the power it consumes imposes a parasitic burden on the system. The torque which the watthour meter is capable of developing is also correspondingly low. The low available torque makes it mandatory to minimize the drag imposed on the rotor. Such drag reduction is most critical in the bearings supporting the disk itself and in the gear mesh in the first gearing stage. In addition, economical manufacture requires a design in which mounting tolerances for the disk and first gearing stage are limited to such small values that the disk and first gearing stage can be installed without requiring adjustment. Furthermore, a design which minimizes the number and complexity of parts aids in reducing cost.

Typically, the disk is supported in the vertical direction by an attractive or repulsive magnetic support bearing, and is located in the radial direction by bearing pins fitted into bearings at the ends of the disk shaft. The first gearing stage usually consists of a worm formed in the disk shaft mating with a worm wheel, or worm gear, mounted on the meter frame. The worm wheel is mounted between bearings in side plates of a bearing cartridge. The bearing cartridge is installed on a machined surface of the meter frame.

The bearings containing the bearing pins at the ends of the disk shaft are mounted in circular holes bored through walls provided in the meter frame for that purpose. The bearing and hole at one end of the frame are frequently of a different diameter from those at the other end of the frame. The holes are bored over-size to permit insertion of the bearings and each is secured in place by a screw which urges the outer surface of the bearing into intimate contact with the inner surface of the hole. Several sources of error accumulate in this technique.

First, it is extremely difficult to maintain close relative positional tolerance in boring a pair of holes in separate walls. Second, the location of the line defining the contact between a cylindrical outer surface of a bearing and a cylindrical inner surface of a hole is indefinite. Third, when bearings and holes of unequal diameter are used, errors in bearing diameter or hole size permit unequal displacement of the axis of the bearings during tightening of the screws and consequently produces an offset between the bearing pins. As a result of these three error sources, the axes of the bearings at the two ends of the frame may be displaced from each other, and one or both may be skewed with respect to the axis of the disk shaft. Such displacement and/or skewing is capable of significantly increasing bearing drag. Finally, it is particularly difficult to maintain absolute tolerances between the holes and other machined surfaces in the meter frame. Thus, the mesh tolerances between the worm and worm wheel, established by the two holes holding the bearings, and the machined surface supporting the worm wheel, are difficult to control.

OBJECTS AND SUMMARY OF THE INVENTION

Accordingly, it is an object of the invention to provide a disk and gear mounting system for an electric watthour meter which overcomes the drawbacks of the prior art.

It is a further object of the invention to provide a disk and gear mounting system in an electric watthour meter frame in which the relative positions and angles of the bearings holding the bearing pins, as well as the positions and angles of the first worm wheel with respect thereto, are all producible in a single machining operation using only linear motion without the need for rotating the electric watthour meter frame and without requiring a change in the machining cutting tool.

It is a still further object of the invention to provide a disk and gear mounting system in an electric watthour meter frame in which the relative positions and angles of the bearings holding the bearing pins, as well as positions and angles of the first worm wheel with respect thereto, are all established by plane surfaces machined in the electric watthour meter frame.

Briefly stated, the present invention provides a watthour meter frame for an electric watthour meter having pairs of orthogonal machined plane surfaces against which disk shaft bearings are urged for accurately positioning the ends of a disk shaft of an electric watthour meter. Clearances are provided in the watthour meter frame for machining all pairs of machined surfaces without changing the cutting tool or rotating the watthour meter frame. Worm gear bearings are similarly positioned in the watthour meter frame against three machined plane surfaces, which may be machined in the same operation, and with the same cutting tool, as used in forming the pairs of machined surfaces for the disk shaft bearings. The worm gear bearings include a cylindrical barrel which is resiliently urged into contact with a pair of plane machined surfaces in a bearing well, and also include a positioning flange having a bearing surface which is resiliently urged into a face surface surrounding the bearing well. Since the disk shaft and the worm gear are both located with respect to accurately machined plane surfaces in the watthour meter frame, sufficient relative and absolute accuracy is obtained to eliminate mesh adjustment of the worm gear.

According to an embodiment of the invention, there is provided a system for mounting rotatable elements in an electric watthour meter comprising a watthour meter frame, a first horizontal machined surface and a first vertical machined surface at a first end of the frame, a first disk bearing, a first cylindrical surface on the first disk bearing, first means for urging the first cylindrical surface into rigid contact with the first horizontal machined surface and the first vertical machined surface whereby the first disk bearing is positioned and secured thereby, a second horizontal machined surface and a second vertical machined surface at a second end of the frame, a second disk bearing, a second cylindrical surface on the second disk bearing, second means for urging the second cylindrical surface into rigid contact with the second horizontal machined surface and the second vertical machined surface whereby the second disk bearing is positioned and secured thereby, a disk shaft rotatably supported by the first and second disk bearings and means in the watthour meter frame for permitting machining of the first and second horizontal machined surfaces and the first and second vertical machined surfaces without requiring rotation of the watthour meter frame, whereby improved positioning accuracy of the first and second disk bearings is achieved.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Figure 1:
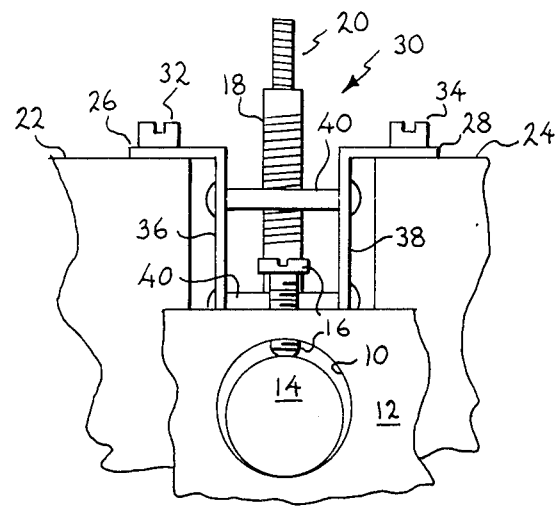
FIG. 1 is a fragmentary view of a watthour meter according to the prior art showing a technique for mounting shaft-support bearings and a worm gear.

Referring to FIG. 1, a disk and worm gear mounting system according to the prior art is shown and described herein to provide a background for understanding the improvement of the present invention. A hole 10 in a wall 12 contains a bearing 14 having a bearing pin (facing in the opposite direction and thus not shown) therein. A clamping screw 16 urges the cylindrical outer surface of bearing 14 into intimate contact with a cylindrical inner surface of hole 10. The bearing pin enters a bearing in the end of a rotor disk shaft (not shown). Similar apparatus is provided at the opposite end of the rotor disk shaft.

Accurate alignment and absolute positioning of the rotor disk shaft relies heavily on the accuracy with which hole 10, and its counterpart at the other end, are bored, and the accuracy with which bearing 14 establishes a line of contact with hole 10. Both of these accuracies are difficult to achieve. Since the workpiece must be rotated and usually must be repositioned between the two boring operations, some disk shaft alignment error can arise. In addition, some installations require different sized holes at the two ends of the disk shaft. Thus, a change in cutting tools is required between the two boring steps which may lead to further error. Furthermore, the position of the line of contact between the two cylindrical surfaces may not be located along the axis of clamping screw 16. As a consequence, the axis of bearing 14 may be displaced both upward and to the side.

A conventional disk shaft includes a worm (not shown) formed into its surface which engages a worm gear 18. As the disk rotates, the worm correspondingly rotates worm gear 18. A second worm gear 20, in mesh with worm gear 18, applies the rotation of worm gear 18 to succeeding mechanical stages of the electric watthour meter.

In order to provide low friction drive, an accurate mesh between the worm and worm gear 18 is vital. Accurately machined surfaces 22 and 24 provide mounting for mounting tabs 26 and 28 of a worm gear cartridge 30. Mounting tabs 26 and 28 are secured by screws 32 and 34. Mounting tabs 26 and 28 support side plates 36 and 38 which are rigidly connected to each other using a plurality of riveted pins 40 (only two of which are shown). Although machined surfaces 22 and 24 can be accurately located with respect to each other, the fact that they are formed in a completely different type of machining operation from that of hole 10 and its counterpart, degrades the accuracy with which worm gear 18 can be positioned with respect to the worm.

Figure 3:
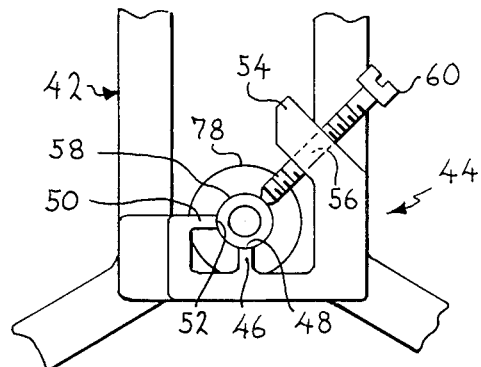
FIG. 3 is an end view of the watthour meter frame taken in the direction 3—3 in FIG. 2.
Figure 2:
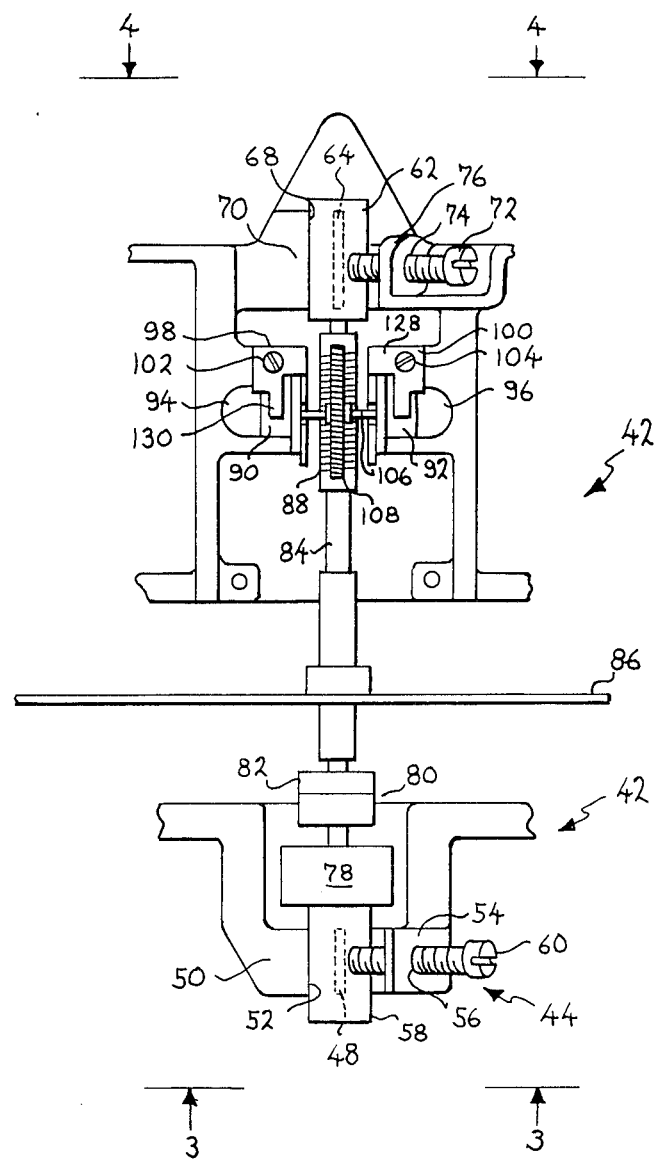
FIG. 2 is a front view of a portion of an electric watthour meter including a watthour meter frame according to an embodiment of the invention.

Referring to FIGS. 2 and 3, there is shown, generally at 42, a portion of a frame for an electric watthour meter (not otherwise shown) according to an embodiment of the invention. In order to simplify the description, the terms horizontal and vertical are used to identify directions in FIG. 3. The actual orientations of the elements described depend on the manner in which frame 42 is mounted.

A bearing support 44 includes a vertical boss 46 having a horizontal machined surface 48. A horizontal boss 50 includes a vertical machined surface 52 spaced from horizontal machined surface 48. An arm 54 includes a diagonal threaded hole 56 whose axis is directed at about 45 degrees to the planes of horizontal machined surface 48 and vertical machined surface 52. A bearing 58, containing a bearing pin (facing in the opposite direction and not shown) is disposed in contact with vertical machined surface 52 and horizontal machined surface 48. A hold-down screw 60, passing through diagonal threaded hole 56, urges the peripheral surface of bearing 58 into two intimate lines of mechanical contact with vertical machined surface 52 and horizontal machined surface 48. The accuracy of positioning bearing 58 is wholly determined by the accuracy with which vertical machined surface 52 and horizontal machined surface 48 are formed. It is a fact, however, that the accuracy with which plane surfaces can be machined is very high, particularly when they are formed with the same cutting tool and without rotating the workpiece or the angle of the axis of the cutting tool. In order to permit cutting-tool access to vertical boss 46 and horizontal boss 50 from the same direction, arm 54 is cantilevered to stop well short of overlapping vertical boss 46. Since horizontal machined surface 48 and vertical machined surface 52 are orthogonal to each other, and since the axis of hold-down screw 60 is at about 45 degrees to each of these surfaces, the cylindrical surface of bearing 58 is urged into two definite lines of contact, and the axis of bearing 58 thereby is positioned in a definite position which is capable of close control in absolute coordinates of frame 42.

Figure 4:
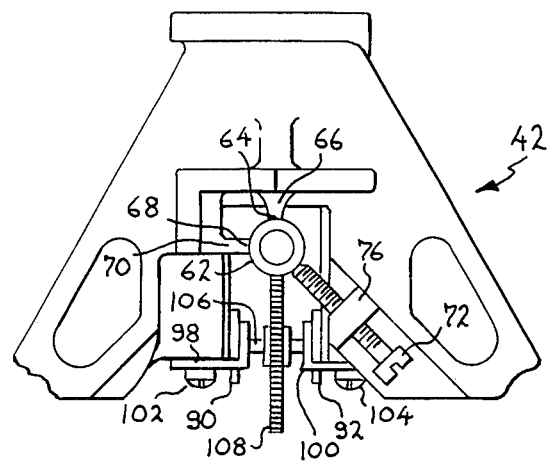
FIG. 4 is an end view of the watthour meter frame taken in the direction 4—4 in FIG. 2.

Referring now also to FIG. 4, a similar bearing 62 is positioned by a horizontal machined surface 64 atop a vertical boss 66, and a machined vertical surface 68 on a horizontal boss 70. Bearing 62 is retained by a hold-down screw 72 fitted into a diagonal threaded hole 74 in a projection 76. It will be noted from FIG. 2 that the entire center of frame 42 is open and accessible to a cutting tool projecting downward from above. Thus, horizontal machined surfaces 48 and 64 and vertical machined surfaces 52 and 68 all can be machined in essentially a single pass of the cutting tool along the length of frame 42, and excellent relative accuracy of these surfaces is readily attainable.

Bearings 58 and 62 have substantially identical diameters. Thus, if horizontal machined surfaces 48 and 64 and vertical machined surfaces 52 and 68 are aligned, then the axes of bearings 58 and 62 should also be aligned with substantially the same high accuracy with which the surfaces are machined.

Referring now specifically to FIG. 2, a stationary member 78 of a magnetic bearing 80 is affixed to bearing 58. A rotatable member 82 of magnetic bearing 80 is engaged with stationary member 78 and is rigidly affixed to a disk shaft 84 supporting a rotatable disk 86. The opposed end of disk shaft 84 is engaged with a bearing pin (not shown) in bearing 62. A worm 88 is formed on the surface of disk shaft 84.

First and second worm gear bearings 90 and 92 are disposed in bearing wells 94 and 96, respectively, where they are resiliently retained by bearing hold-down springs 98 and 100 secured by screws 102 and 104. A shaft 106 of a worm gear 108 is rotatably supported in worm gear bearings 90 and 92. Gear teeth on a peripheral surface of worm gear 108 are maintained in mesh with worm 88. As will be explained below, critical positioning of worm gear bearings 90 and 92 is achieved by plane machined surfaces which may be formed in the same machining operation, and using the same machining tool, as used to form the plane surface supporting bearings 58 and 62. Thus, the absolute position accuracies of worm gear bearings 90 and 92 in coordinates of frame 42 should be substantially the same as those of bearings 58 and 62. The relative positions of worm gear 108 and worm 88 are therefore maintained with sufficiently low tolerances to permit assembly without requiring subsequent adjustment.

The displacements and angles of each of worm gear bearings 90 and 92 are established and maintained by interaction with three plane machined surfaces which are also formed in the same machining operation as the remainder of the mounting system previously described and without the need for rotating frame 42.

Figure 6:
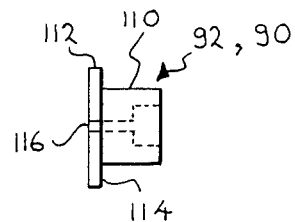
FIG. 6 is a side view of the worm gear bearing of FIG. 5.
Figure 5:
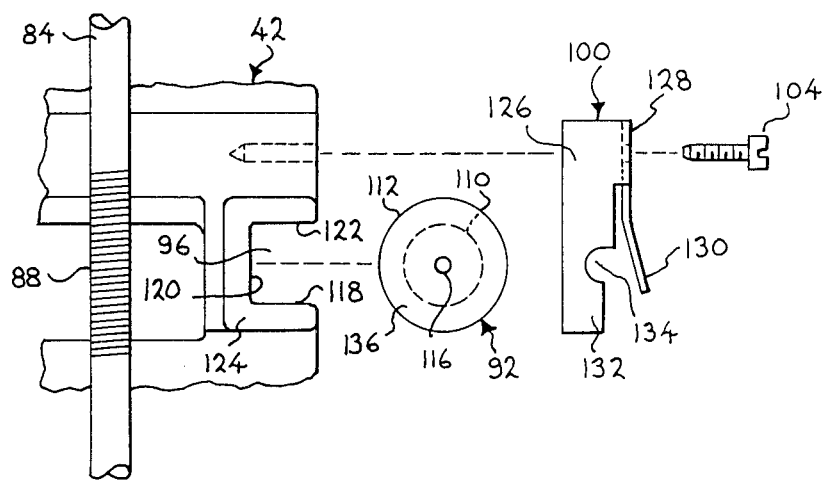
FIG. 5 is an exploded view of a worm gear bearing of FIG. 2 and its bearing hold-down spring positioned adjacent a bearing well in the watthour meter frame.

Referring now to FIGS. 5 and 6, worm gear bearing 92, which is identical to worm gear bearing 90, includes a cylindrical barrel 110 having a positioning flange 112 at one extremity thereof. Positioning flange 112 includes a bearing surface 114 adjacent cylindrical barrel 110. An axial bearing hole 116 accepts an end of shaft 106 (FIGS. 2 and 4). Worm gear bearing 92 (as well as worm gear bearing 90) is preferably made of a plastic resin and, more preferably, made of a plastic resin having lubricating properties such as, for example, Nylon, Teflon or Nylatron.

A plane horizontal side surface 118 is accurately machined on one side of bearing well 96, and extends into bearing well 96 at least as deep as the length of cylindrical barrel 110. A plane vertical bottom surface 120 is similarly accurately machined in the bottom of bearing well 96, and also extends into bearing well 96 at least as deep as the length of cylindrical barrel 110. The other horizontal side surface 122 of bearing well 96 does not require machining and may optionally remain in the as-cast condition. A face surface 124 is accurately machined in frame 42 surrounding bearing well 96.

Bearing hold-down spring 100 includes a side plate 126 and a top plate 128 (better seen in FIG. 5). Worm gear bearing 92 is installed in bearing well 96 with cylindrical barrel 110 contacting horizontal side surface 118 and vertical bottom surface 120, and bearing surface 114 contacting face surface 124. Bearing hold-down spring 100 resiliently urges worm gear bearing 92 into contact with these surfaces. More specifically, top plate 128 includes a cantilevered angled spring 130 which, in bearing resiliently upon cylindrical barrel 110, urges cylindrical barrel 110 into contact with horizontal side surface 118 and vertical bottom surface 120. This establishes the vertical, horizontal and skew positions of worm gear bearing 92 with an accuracy comparable to the accuracy with which horizontal side surface 118 and vertical bottom surface 120 are formed. Cylindrical barrel 110 does not contact horizontal side surface 122 in its operational position.

Side plate 126 includes a cantilevered blade 132 having a notch 134 in its upper edge. Cantilevered blade 132 fits against a face 136 of positioning flange 112 below axial bearing hole 116. Notch 134 provides clearance for shaft 106 (FIGS. 2 and 4) to enter axial bearing hole 116. Cantilevered blade 132 resiliently urges bearing surface 114 into firm contact with face surface 124 surrounding three sides of rotatable disk 86, thereby accurately establishing an axial position of worm gear bearing 92.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A system for mounting rotatable elements in an electric watthour meter comprising:
   a watthour meter frame;
   a first horizontal machined surface and a first vertical machined surface at a first end of said frame;
   a first disk bearing;
   a first cylindrical surface on said first disk bearing;
   first means for urging said first cylindrical surface into rigid contact with said first horizontal machined surface and said first vertical machined surface whereby said first disk bearing is positioned and secured thereby;
   a second horizontal machined surface and a second vertical machined surface at a second end of said frame;
   a second disk bearing;
   a second cylindrical surface on said second disk bearing;
   second means for urging said second cylindrical surface into rigid contact with said second horizontal machined surface and said second vertical machined surface whereby said second disk bearing is positioned and secured thereby;

a disk shaft rotatably supported by said first and second disk bearings; and means in said watthour meter frame for permitting machining of said first and second horizontal machined surfaces and said first and second vertical machined surfaces without requiring rotation of said watthour meter frame, whereby improved positioning accuracy of said first and second disk bearings is achieved.

2. A system according to claim 1 wherein said first means for urging includes a threaded member having a diagonal threaded hole therein, said diagonal threaded hole having an axis inclined at about 45 degrees to said first horizontal machined surface and said first vertical machined surface, and a hold-down screw in said diagonal threaded hole effective to contact said first cylindrical surface and to urge said first cylindrical surface into rigid contact with said first horizontal machined surface and said first vertical machined surface.

3. A system according to claim 2 wherein at least one of said means for urging includes an arm cantilevered over said first disk bearing.

4. A system according to claim 3 wherein said means for permitting machining includes said arm terminating short of overlapping either said horizontal machined surface or said vertical machined surface whereby access of a cutting tool to said horizontal machined surface and said vertical machined surface is enabled without requiring rotation of said watthour meter frame.

5. A system according to claim 1 wherein said disk shaft includes a worm, further comprising:

means for supporting a worm gear in mesh with said worm;

said means for supporting including first and second bearing wells, said first bearing well being disposed in said frame on a first side of said worm gear and said second bearing well being disposed in said frame on a second side of said worm gear;

a first side surface in said first bearing well;
a second side surface in said second bearing well;
a first bottom surface in said first bearing well;
a second bottom surface in said second bearing well;
first and second worm gear bearings;

said first and second worm gear bearings each including a cylindrical barrel;

said first worm gear bearing fitting into said first bearing well and said cylindrical barrel thereof contacting said first side surface and said first bottom surface;

a first bearing hold-down spring;

said first bearing hold-down spring including means for resiliently urging said cylindrical barrel of said first worm gear bearing into contact with said first side surface and said first bottom surface whereby said first worm gear bearing is accurately positioned with respect to said worm;

said second worm gear bearing fitting into said second bearing well and said cylindrical barrel thereof contacting said second side surface and said second bottom surface;

a second bearing hold-down spring;

said second bearing hold-down spring including means for resiliently urging said cylindrical barrel of said second worm gear bearing into contact with said second side surface and said second bottom surface whereby said second worm gear bearing is accurately positioned with respect to said worm; and said means for supporting further including a worm gear shaft engaging said first and second worm gear bearings and positioning said worm gear with respect thereto, whereby said worm gear is positioned in mesh with said worm.

6. A system according to claim 5, further comprising first and second face surfaces in said watthour meter frame surrounding an end of said first and second bearing wells, said first and second worm gear bearing each including a positioning flange at an end of said cylindrical barrel, said positioning flange including a bearing surface effective to bear against its face surface whereby said worm gear bearing is further positioned.

7. A system according to claim 6 wherein said bearing hold-down spring includes a cantilevered blade, said cantilevered blade contacting an outer face of its worm gear bearing and effective for urging said bearing surface into contact with said face surface.

* * * * *